(12) United States Patent
Innocent et al.

(10) Patent No.: US 12,047,697 B2
(45) Date of Patent: Jul. 23, 2024

(54) PIXEL CIRCUITRY WITH VOLTAGE-DOMAIN SAMPLING

(71) Applicant: SEMICONDUCTOR COMPONENTS INDUSTRIES, LLC, Phoenix, AZ (US)

(72) Inventors: Manuel H. Innocent, Wezemaal (BE); Tomas Geurts, Haasrode (BE); Genis Chapinal Gomez, Antwerp (BE); Tze Ching Fung, Fremont, CA (US); Bartosz Piotr Banachowicz, San Jose, CA (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 304 days.

(21) Appl. No.: 17/649,815

(22) Filed: Feb. 3, 2022

(65) Prior Publication Data

US 2022/0264042 A1 Aug. 18, 2022

Related U.S. Application Data

(60) Provisional application No. 63/150,799, filed on Feb. 18, 2021.

(51) Int. Cl.
*H04N 25/75* (2023.01)
*H01L 27/146* (2006.01)
*H04N 25/59* (2023.01)

(52) U.S. Cl.
CPC ....... *H04N 25/75* (2023.01); *H01L 27/14612* (2013.01); *H01L 27/14643* (2013.01); *H04N 25/59* (2023.01)

(58) Field of Classification Search
CPC ...... H04N 25/75; H04N 25/59; H04N 25/771; H04N 25/585; H04N 25/709; H01L 27/14612; H01L 27/14643
See application file for complete search history.

(56) References Cited

U.S. PATENT DOCUMENTS

2012/0193516 A1 8/2012 Bogaerts
2012/0256077 A1* 10/2012 Yen .................. H01L 27/14643
250/208.1

(Continued)

OTHER PUBLICATIONS

Park et al. "A 2.2 μm stacked back side illuminated voltage domain global shutter CMOS image sensor." 2019 IEEE International Electron Devices Meeting (IEDM) (2019): 16.4.1-16.4.4.

*Primary Examiner* — Nhan T Tran
(74) *Attorney, Agent, or Firm* — Treyz Law Group, P.C.; Tianyi He

(57) ABSTRACT

An image sensor may include an array of image pixels. The array of image pixel may be coupled to row control circuitry and column readout circuitry. An image pixel in the array may include a charge integration portion having a photodiode, a floating diffusion region, and a capacitor coupled to the floating diffusion region and may include a voltage-domain sampling portion having three capacitors. High light and low light image level and reset level signals may be sampled and stored at the voltage-domain sampling portion before being readout to the column readout circuitry during a readout operation. The high light reset level signal may be sampled and stored during the readout operation.

20 Claims, 8 Drawing Sheets

(56) References Cited

U.S. PATENT DOCUMENTS

| | | | |
|---|---|---|---|
| 2015/0229859 A1* | 8/2015 | Guidash | H04N 25/76 |
| | | | 348/308 |
| 2017/0104946 A1 | 4/2017 | Hong | |
| 2017/0366764 A1 | 12/2017 | Innocent et al. | |
| 2018/0227516 A1* | 8/2018 | Mo | H01L 27/14609 |
| 2020/0112697 A1* | 4/2020 | Huang | H01L 27/14605 |
| 2020/0251512 A1* | 8/2020 | Im | H01L 27/14623 |

* cited by examiner

PIXEL CIRCUITRY WITH VOLTAGE-DOMAIN SAMPLING

This application claims the benefit of U.S. provisional patent application No. 63/150,799, filed Feb. 18, 2021, which is incorporated by reference herein in its entirety.

BACKGROUND

This relates generally to imaging systems, and more particularly, to image sensors in the imaging systems.

Image sensors are commonly used in electronic systems or devices to generate image data. In a typical arrangement, an image sensor includes an array of image sensor pixels, each image sensor pixel containing a photodiode for generating charge based on incident light.

It may be desirable to provide image sensor pixels, especially image sensor pixels having a high dynamic range functionality and a voltage-domain sampling functionality, with a compact design, while providing enhanced performance.

DETAILED DESCRIPTION

Electronic systems such as cameras, computers, cellular telephones, automotive electronic systems, industrial electronic systems, and other electronic systems can include image sensors that gather incident light to generate image data (e.g., capture one or more images and/or video). The image sensors can include one or more arrays of image sensor pixels. The image sensor pixels can include photosensitive elements such as photodiodes that convert the incident light into image charge. The image sensors can have any number of image sensor pixels (e.g., hundreds or thousands or more). A typical image sensor can, for example, have hundreds of thousands or millions of image sensor pixels (e.g., megapixels). The image sensors can include control circuitry such as circuitry for operating (e.g., controlling the operation of) the image sensor pixels and readout circuitry for reading out image signals corresponding to the image charge generated by the photosensitive elements.

Figure 1:
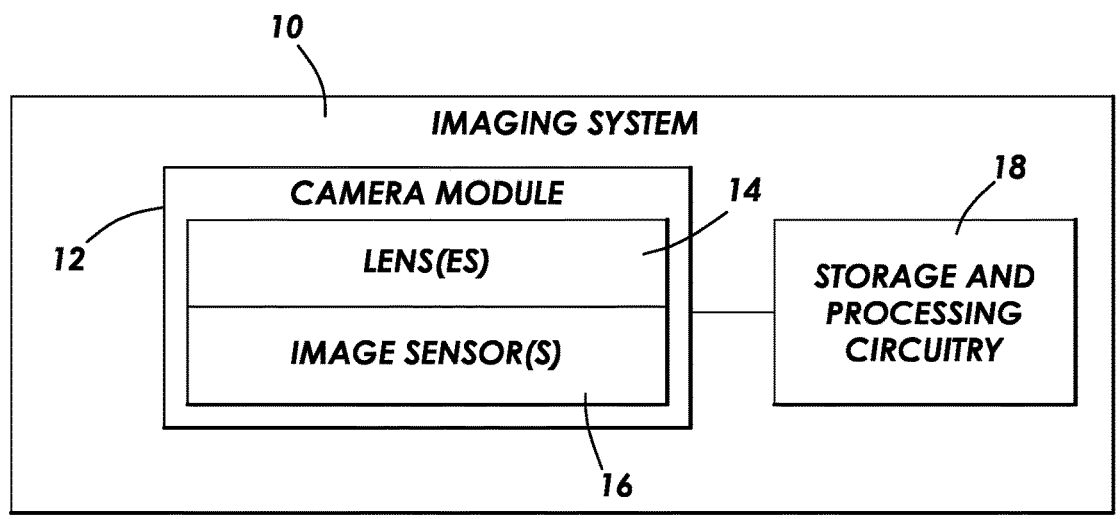
FIG. 1 is a functional block diagram of an illustrative imaging system having one or more image sensors and processing circuitry for generating image data in accordance with some embodiments.

FIG. 1 is a functional block diagram of an illustrative imaging system (e.g., an electronic system with imaging capabilities) such as imaging system 10. Imaging system 10 of FIG. 1 may be (e.g., form part of) a portable electronic device such as a camera, a cellular telephone, a tablet computer, a laptop computer, a webcam, or a video camera, may be other types of imaging systems such as a video surveillance system, an automotive system (e.g., an automotive electronic system, an automotive sensor system, an automotive imaging system, an embedded system in automotive electronics, or any other part of an automotive system), a video gaming system with imaging capabilities, an augmented reality and/or virtual reality system, an unmanned aerial vehicle system (e.g., a drone), or an industrial electronic system, or may be any other suitable imaging systems or devices that generate image data.

Imaging system 10 includes camera module 12 (sometimes referred to as imaging module 12). Camera module 12 may be used to convert incoming light into digital image data. Camera module 12 may include one or more lenses 14 and one or more corresponding image sensors 16. Lenses 14 may include fixed and/or adjustable lenses and may include microlenses formed on an imaging surface of image sensor 16 and other macro lenses. If desired, camera module 12 may be provided with an array of lenses 14 and an array of corresponding image sensors 16.

During image capture operations, light from a scene may be focused onto image sensor 16 by lenses 14. Image sensor 16 may include circuitry for converting analog pixel image signals into corresponding digital image data that is provided to storage and processing circuitry 18.

Storage and processing circuitry 18 (sometimes referred to herein collectively as control circuitry 18) may include and be implemented on one or more integrated circuits (e.g., one or more integrated circuit dies). As illustrative examples, the processing component of circuitry 18 may include one or more image processing circuits or digital signal processors, one or more microprocessors or microcontroller, one or more (general or special purpose) processors each having one or more processing cores, or any other suitable circuitry for manipulating or processing data. The storage component of circuitry 18 may include non-volatile memory circuitry such as a hard drive, a solid-state drive, read-only memory, and/or any other type of non-volatile memory circuitry, or other data storage devices. If desired, circuitry 18 may include volatile memory such as random-access memory.

In some illustrative configurations described herein as examples, the storage component of circuitry 18 (e.g., non-transitory computer-readable media) stores instructions (e.g., software, firmware, code, etc.) executable by the processing component of circuitry 18. When executed by the processing component of circuitry 18, these instructions can implement one or more processes (e.g., processing schemes, control schemes, etc.) described herein. In such a manner, control circuitry 18 can be configured to control the operations of imaging system 10 (e.g., components such as image sensor 16 or other components within imaging system 10).

Control circuitry 18 may be implemented using components that are separate from camera module 12 and/or that form part of the camera module (e.g., circuits that form part of an integrated circuit that includes image sensor 16 or an integrated circuit within the module that is associated with image sensor 16). When control circuitry 18 is included on different integrated circuits (e.g., chips) than those of one or more image sensors 16, the integrated circuits associated with control circuitry 18 may be stacked to or packaged together with the integrated circuits associated with one or more image sensors 16. Image data that has been generated by camera module 12 may be processed and stored using control circuitry 18 (e.g., using an image processing engine in control circuitry 18, using an imaging mode selection engine in control circuitry 18, etc.). Processed image data may, if desired, be provided to external equipment (e.g., a computer, an external display, an electronics control unit, an external system to which imaging system 10 is a sub-system, or other systems or devices) using wired and/or wireless communications paths coupled to control circuitry 18.

Figure 2:
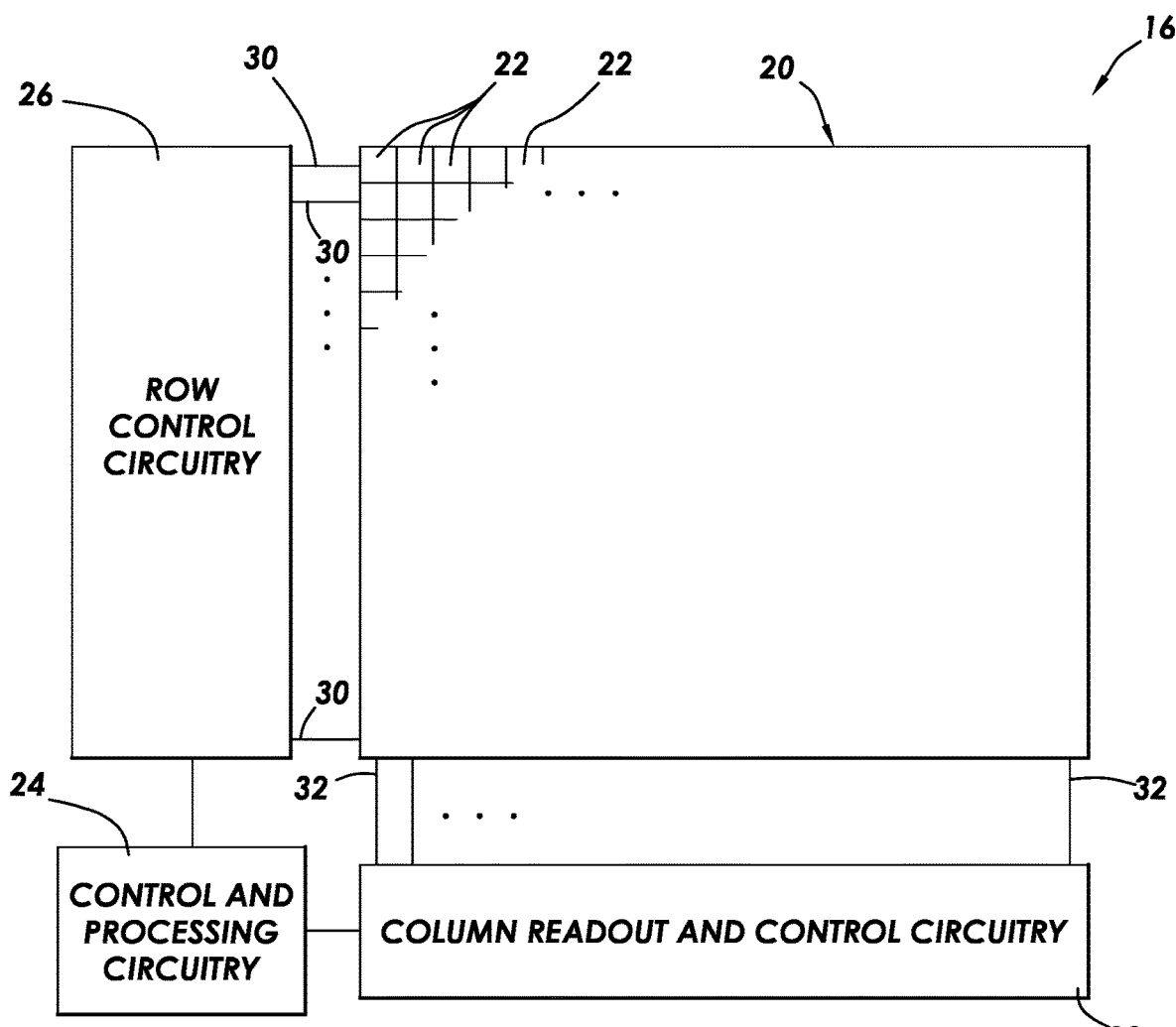
FIG. 2 is a functional block diagram of illustrative image sensor circuitry having a pixel array and control and readout circuitry for the pixel array in accordance with some embodiments.

FIG. 2 is a functional block diagram of an illustrative image sensor such as image sensor 16 (e.g., that may be implemented as image sensor 16 in system 10 in FIG. 1). As shown in FIG. 2, image sensor 16 includes a pixel array 20 containing image sensor pixels 22 (sometimes referred to herein as image pixels 22 or pixels 22). In some configurations described herein as illustrative examples, image pixels 22 may be arranged in rows and columns. Array 20 may contain, for example, hundreds or thousands of rows and columns of image pixels 22.

In the example of FIG. 2, image sensor 16 includes control and processing circuitry 24 (sometimes referred to herein as control circuitry 24). Control circuitry 24 is coupled to row control circuitry 26 (sometimes referred to as row driver circuitry 26) and column readout and control circuitry 28 (sometimes referred to as column control circuitry 28, column readout circuitry 28, or readout circuitry 28). Control circuitry 24 may provide timing controls for row control circuitry 26 (e.g., may receive row addresses for which certain control signals are to be asserted or deasserted). Accordingly, based on the timing controls, row control circuitry 26 may supply (e.g., assert or deassert) corresponding row control signals such as reset, anti-blooming, row select, charge transfer, dual conversion gain (e.g., low conversion gain), readout, and/or any other suitable pixel control signals to each row of pixels 22 over one or more conductive paths for that row (e.g., over row control paths 30).

One or more conductive paths such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 can be selected using row control circuitry 26, and image signals generated by image pixels 22 in that pixel row can be read out along column lines 32.

Column readout circuitry 28 may receive image signals (e.g., analog pixel values generated by pixels 22) over column lines 32. Column readout circuitry 28 may include memory circuitry for temporarily storing calibration signals (e.g., reset level signals, reference level signals) and/or image signals (e.g., image level signals) read out from array 20, amplifier circuitry, analog to digital conversion (ADC) circuitry, bias circuitry, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Column readout circuitry 28 may supply the digital pixel data associated with pixels in one or more pixel columns to control and processing circuitry 24 and/or storage and processing circuitry 18 (FIG. 1).

One or more of control and processing circuitry 24, row control circuitry 26, and column readout and control circuitry 28, may be referred to herein as control circuitry (for image sensor 16). In particular, the control circuitry may be configured to control the operation (e.g., a shutter operation, a charge integration operation, a readout operation, etc.) of one or more pixels 22 in array 20 in generating image data (e.g., analog image signals and subsequently digital image data). The control circuitry may include associated storage circuitry (e.g., non-transitory computer-readable media) configured to store instructions (e.g., software, firmware, code, etc.) executable by the processing component of the control circuitry. When executed by the processing component of the control circuitry, these instructions can implement one or more processes (e.g., processing schemes, control schemes, etc.) described herein (e.g., one or more timing diagrams for controlling one or more pixels 22 in array 20). In such a manner, the control circuitry can be configured to control the operations of pixels 22 and/or other components in image sensor 16.

Additionally, pixel array 20 may be provided with a filter array having multiple (color) filter elements (each corresponding to one or more respective pixels) which allows a single image sensor to sample light of different colors or sets of wavelengths. As an example, image sensor pixels 22 in array 20 may be provided with a color filter array having red, green, and blue filter elements, which allows a single image sensor to sample red, green, and blue (RGB) light using corresponding red, green, and blue image sensor pixels arranged in a Bayer mosaic pattern. As another example, the green pixels in a Bayer pattern may be replaced by broadband image pixels having broadband color filter elements (e.g., clear color filter elements, yellow color filter elements, etc.). In yet another example, one of the green pixels in a Bayer pattern may be replaced by infrared (IR) image pixels formed under IR filter elements and/or the remaining red, green, and blue image pixels may also be sensitive to IR light (e.g., may be formed under filter elements that pass IR light in addition to light of their respective colors). These examples are merely illustrative. In general, filter elements of any desired color and/or wavelength and in any desired pattern may be formed over any desired number of image pixels 22.

Figure 3:
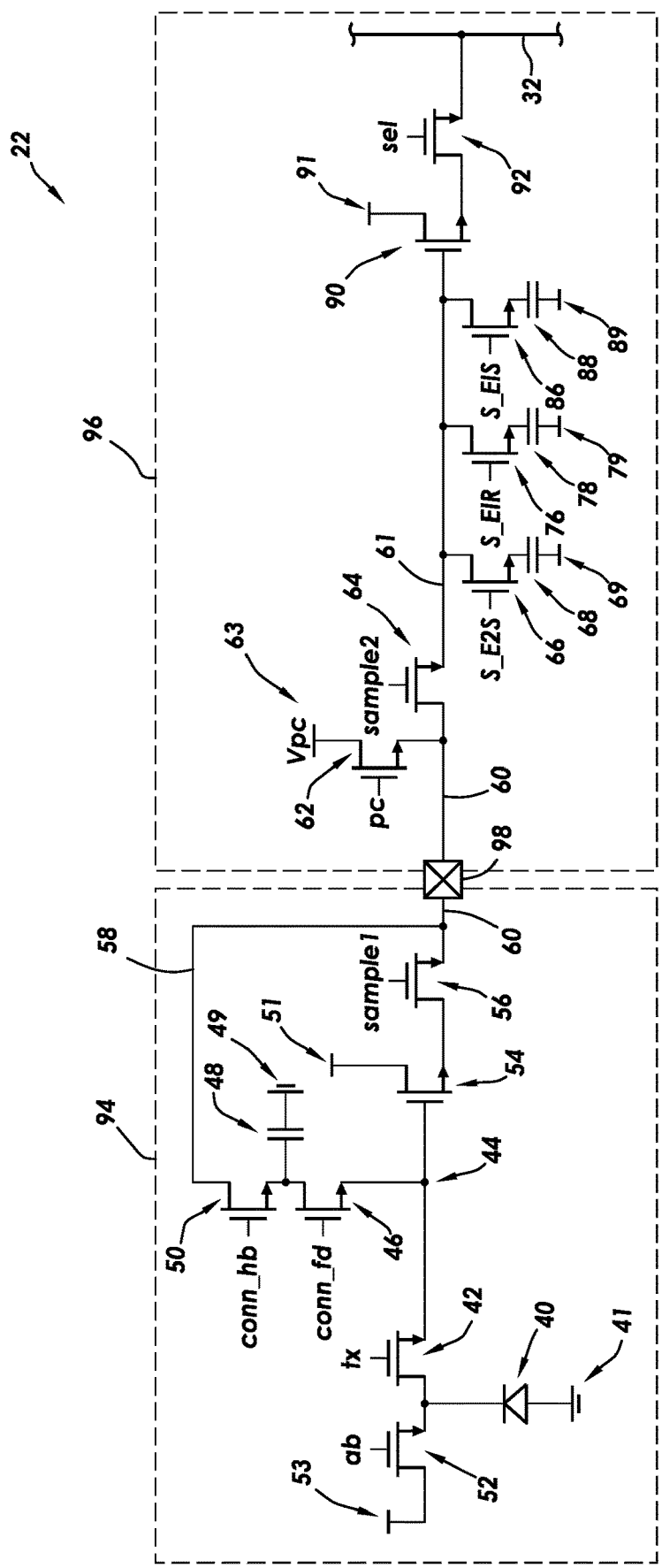
FIG. 3 is a circuit diagram of an illustrative image sensor pixel having voltage-domain sampling circuitry in accordance with some embodiments.

FIG. 3 is a circuit diagram of an illustrative image sensor pixel such as image sensor pixel 22 (e.g., that may be implemented as one or more image sensor pixels 22 in FIG. 2). As shown in FIG. 3, pixel 22 includes a photosensitive element such as photodiode 40 (e.g., a pinned photodiode with a pinning voltage). Photodiode 40 has a first terminal coupled to a voltage terminal 41 that receives a reference voltage (e.g., a ground voltage) and a second terminal at which image charge is integrated and stored. Photodiode 40 may generate charge (e.g., electrons) in response to receiving incident light (e.g., impinging photons). The amount of charge that is generated by photodiode 40 may depend on the exposure duration (or integration time) and the intensity of the incident light (e.g., in a high-light environment, in a mid-light environment, in a low-light environment, etc.).

Pixel 22 in FIG. 3 also includes a floating diffusion region such as floating diffusion region 44. Floating diffusion region 44 may be a doped semiconductor region (e.g., a region in a silicon substrate that is doped by ion implantation, impurity diffusion, or any other doping process). Accordingly, floating diffusion region 44 may have an associated charge storage capacity (e.g., can be schematically shown as a capacitor with one terminal at floating diffusion node 44 and one terminal at a reference voltage). Photodiode-generated charge and/or other charge (e.g., reset voltage level charge, dark current charge, etc.) may be transferred to and stored at floating diffusion region 44 for one or more sampling or readout operations.

In the example of FIG. 3, charge transfer transistor 42 receiving control signal 'tx' at its control (gate) terminal may couple photodiode 40 to floating diffusion region 44. Transistor 42 may therefore be activated (when control signal 'tx' is asserted, fully or partially) to transfer photodiode-generated charge to floating diffusion region 44.

For high dynamic range applications, it may be desirable to extend the storage capacity of floating diffusion region 44 and operate pixel 22 in a low (conversion) gain mode of (readout) operation by including a low (conversion) gain charge storage structure. As shown in FIG. 3, pixel 22 includes a charge storage structure such as capacitor 48 (e.g., a low gain capacitor). Capacitor 48 has a first terminal coupled to a voltage terminal 49 and a second terminal that serves as its charge storage terminal. Voltage terminal 49 may be configured to provide a controllable and variable voltage signal (e.g., exhibiting a first voltage across a first time period and exhibiting a second voltage across a second period of time) or to provide a fixed voltage (e.g., a ground or supply voltage).

Capacitor 48 is coupled to floating diffusion region 44 by transistor 46 receiving control signal 'conn_fd' at its control terminal. When transistor 46 is activated (e.g., when control signal 'conn_fd' is asserted), capacitor 48 may be electrically connected to floating diffusion region 44, thereby extending the charge storage capacity of floating diffusion region 44. Additionally, when transistors 42 and 46 are both activated (e.g., when control signals 'tx' and 'conn_fd' are both partially asserted), a portion of photodiode-generated charge may be transferred from photodiode 40 to capacitor 48. The portion of photodiode-generated charged may be determined by the voltage barrier set by transistors 42 and 46 when they are partially asserted.

To reset one or more pixel elements (e.g., to a reset voltage level), pixel 22 may include one or more transistors connected to voltage source(s) such as transistor 62 receiving control signal 'pc' at its control terminal. As shown in FIG. 3, transistor 62 couples a voltage terminal 63 to capacitor 48 (via intervening transistor 50) and to floating diffusion region 44 (via intervening transistors 50 and 46). In particular, when transistors 46, 50, and 62 are all activated (e.g., when control signals 'conn_fd', 'conn_hb', and 'pc' are all asserted), floating diffusion region 44 and (a storage terminal of) capacitor 48 may be reset to a reset voltage level (e.g., a power supply voltage). Voltage terminal 63 may be configured to provide a controllable and variable voltage signal (e.g., exhibiting a first voltage such as a reset voltage level across a first time period such as a reset operation time period and exhibiting a different second voltage such as a reference voltage level across a second period of time).

Additionally, pixel 22 may include (anti-blooming) transistor 52 coupling voltage terminal 53 to photodiode 40. Voltage terminal 53, as an example, may be configured to provide a reset voltage level (e.g., a power supply voltage). As such, transistor 52, when activated (by asserting control signal 'ab'), may reset photodiode 40 to a reset voltage level.

Pixel 22 in FIG. 3 also includes source follower transistor 54 coupled to voltage terminal 51 (e.g., providing a power supply voltage) and a sampling transistor 56, the combination of which forms a first sampling path. Sampling transistor 56 has a control (gate) terminal that is controlled by control signal 'sample1'. When control signal 'sample1' is asserted and transistor 56 is activated, a corresponding output signal having a magnitude that is proportional to the amount of charge at floating diffusion region 44 is passed onto path 60 via source follower transistor 54. When floating diffusion region 44 stores photodiode-generated charge that is being sampled or read out, the corresponding output signal on path 60 may be referred to as an image (level) signal. When floating diffusion region 44 stores reset voltage level charge that is being sampled or read out, the corresponding output signal on path 60 may be referred to as a reset level signal.

Path 58 forms a second sampling path bypassing transistors 54 and 56, thereby enabling a sampling path that directly connects capacitor 48 and floating diffusion region 44 to path 60 when transistors 46 and 50 are activated. Accordingly, photodiode-generated charge (e.g., capacitor-integrated charge) sampled or read out using this second path may also be referred to as an image (level) signal, whereas if applicable, reset voltage level charge that is being sampled or read out using this path may also be referred to as a reset level signal.

An image sensor having an array of image pixels may operate in varying light conditions (e.g., in a relatively low-light environment, in a relatively high-light environment, in an intermediate (mid) light environment between the low- and high-light environment, etc.). In some applications (e.g., for high dynamic range applications), it may be desirable for the image pixel to generate more than one image signal (e.g., two image signals, three image signals, etc.) for each integration cycle (e.g., for each integration time period). These image signals may be sampled or read out with varying conversion gains.

In one illustrative example, image pixel 22 may be configured to separate the generated image charge into an overflow portion (sometimes referred to herein as overflow charge) and a remaining portion that remains stored at the photodiode (sometimes referred to herein as remaining photodiode charge). In one illustrative sampling scheme, the overflow charge is sampled in a low conversion gain configuration in which a low gain capacitor such as capacitor 48 is used (to desirably use the extended storage capacity of the low gain configuration), and the remaining photodiode charge is sampled in a high conversion gain configuration (to desirably use the low noise characteristic of the high gain configuration). The high conversion gain signal may be used for a relatively low light environment, the low conversion gain signal may be used for a relatively high light environment, and a (linear or nonlinear, as suitable) combination of the high and low conversion gain signals may be used for a light environment between the low and high light environments. This illustrative operating scheme may help with operating in varying light conditions (e.g., provide high dynamic range functionalities).

Pixel 22 includes voltage-domain sampling circuitry (sometimes referred to as voltage-domain correlated double sampling circuitry, a voltage-domain (correlated double) sampling stage, or simply sampling circuitry or a charge sampling portion of pixel 22) in addition to the above-mentioned charge integration portion of pixel 22 (including photodiode 40, floating diffusion region 44, capacitor 48, and the various interconnecting transistors and sampling paths). The voltage-domain sampling circuitry may be coupled to path 60 on the opposite side of the first and second sampling paths (e.g., path 58 and path formed by transistors 54 and 56).

The sampling portion of pixel 22 includes transistor 62 coupling voltage terminal 63 to path 60 and other pixel elements through path 60. The sampling circuitry also includes a plurality of charge storage structures or capacitors (e.g., exactly three capacitors, fewer than four capacitors, etc.) such as capacitors 68, 78, and 88 coupled to path 61 via corresponding transistors 66, 76, and 86. Each capacitor has a terminal coupled to a voltage terminal (e.g., voltage terminals 69, 79, and 89) each receiving a fixed reference voltage or a controllable and variable voltage signal. Sampling transistor 64 couples path 60 to path 61 and may control the sampling of pixel signals onto path 61 and into the voltage-domain sampling circuitry (e.g., using control signal 'sample2').

The sampling portion of pixel 22 includes a source follower transistor 90 coupled to voltage terminal 91 (e.g., providing a power supply voltage) and a pixel or row select transistor 92. Select transistor 92 has a control (gate) terminal that is controlled by control signal 'sel'. When control signal 'sel' is asserted and transistor 92 is activated, a corresponding pixel output signal having a magnitude that is proportional to the amount of charge at one of capacitors 68, 78, or 86 connected to path 61 is passed onto a pixel output path (e.g., a path coupled to column line 32) via source follower transistor 90. As analogously described above, when the capacitor stores photodiode-generated charge that is being read out, the corresponding output signal on column line 32 may be referred to as an image (level) signal. When the capacitor stores reset voltage level charge that is being read out, the corresponding output signal on column line 32 may be referred to as a reset level signal.

In an illustrative image pixel array configuration, there are numerous rows and columns of pixels 22. A column line 32 may be associated with each column of pixels 22 (e.g., each image pixel 22 in a column may be coupled to the same column line 32 through a corresponding row select transistor 92). Control signal 'sel' may be asserted to read out a pixel output signal from a selected image pixel 22 onto column line 32. The pixel output signal may be provided to column readout circuitry 28 (FIG. 2), and thereafter, to processing circuitry 18 (FIG. 1) for further processing.

In some illustrative configurations, it may be desirable for a pixel to output (via a column line) four signals per integration cycle to achieve high dynamic range functionalities with satisfactory performance. These four signals may include a high conversion gain image level signal (for the low light regime), a high conversion gain reset level signal, a low conversion gain image level signal (for the high light regime), and a low conversion gain reset level signal. Accordingly, some pixels may each include four capacitors, each configured to store one of the four signals, in the voltage-domain sampling circuitry.

However, providing a large number of capacitors, especially on a per-pixel basis may be undesirable as each capacitor takes up a substantial amount of space on the pixel. As such, it may be desirable to decrease the number of capacitors, while still providing the desired functionalities. If desired, the saved area may be used to provide a more compact pixel, may be used to expand the area of existing capacitor (thereby enhancing noise performance), etc.

Accordingly, as one illustrative example, pixel 22 of FIG. 3 provides such a sampling portion having only three capacitors or charge storage structures (e.g., fewer than four capacitors), while being configured to output the four desired signals per integration cycle.

In particular, capacitor 68 may be configured to store the low conversion gain image level signal. The low conversion gain image level signal may result from the overflow charge stored at capacitor 48 (in combination with the other portions of photodiode-generated charge). The low conversion gain image level signal may be sampled by electrically connecting capacitor 68 to capacitor 48 and floating diffusion region (e.g., in a charge-sharing operation). As an example, transistors 66, 64, 50, and 46 may be activated by asserting control signals 'S_E2S', 'sample2', 'conn_hb', and 'conn_fd' to perform this sampling operation.

Capacitor 78 may be configured to store the high conversion gain reset level signal. The high conversion gain reset level signal may result from floating diffusion region 44 storing reset level charge (e.g., after being connected to voltage terminal 63 supplying a reset voltage level). The high conversion gain reset level signal may be sampled through source follower 54 by electrically connecting the output of source follower 54 (when reset level charge is at floating diffusion region 44) to capacitor 78. As an example, transistors 76, 64, and 56 may be activated by asserting control signals 'S_E1R', 'sample2', and 'sample 1' to perform this sampling operation.

Capacitor 88 may be configured to store the high conversion gain image level signal. The high conversion gain image level signal may result from floating diffusion region 44 storing image level charge (e.g., after the remaining portion of photodiode-integrated charge is transferred from photodiode 40 using transistor 42). The high conversion gain image level signal may be sampled through source follower 54 by electrically connecting the output of source follower 54 (when image level charge is at floating diffusion region 44) to capacitor 88. As an example, transistors 86, 64, and 56 may be activated by asserting control signals 'S_E1S', 'sample2', and 'sample 1' to perform this sampling operation.

A dedicated capacitor for storing the low conversion gain reset level signal may be omitted from the sampling portion of pixel 22. In particular, capacitor 68 may be configured to also store the low conversion gain reset level signal. As an illustrative example, after the low conversion gain image level signal sampled and stored at capacitor 68 has been read out through column line 32, capacitor 68 may be electrically connected to a reset level voltage (at terminal 63), which provides the low conversion gain reset level signal stored at capacitor 68. In particular, transistors 66, 64, and 62 may be activated by asserting control signals 'S_E2S', 'sample2', and 'pc' to perform this sampling operation.

In this manner, a dedicated capacitor for storing the low conversion gain reset level signal may be omitted, thereby providing space savings for the pixel while providing the desired functionalities. If desired, the saved space may be used to expand the storage capacity of one or more of the other three capacitors. As an example, the space savings may be used to increase the storage capacity of capacitor 68 (for the high light signal), which improves noise performance.

Additionally, because sampling of the low conversion gain reset level signal is performed without a source-follower or amplifier stage (e.g., transistor 54), path 58 (e.g., a path bypassing transistor 54) is also used for the sampling of the low conversion gain image level signal. This avoids mismatches between the two signals and improves noise performance.

Capacitors 48, 68, 78, and 88 may be formed using any suitable technology and/or may be of any suitable type. In an illustrative configuration, capacitor 68 may be formed using a metal-oxide-semiconductor (MOS) capacitor, and capacitors 78 and 88 may each be formed using a (3-D) metal-insulator-metal (MiM) capacitor. If desired, capacitor 48 may also be a MOS capacitor. If desired, the storage capacities of capacitors 78 and 88 may be similar to each other (e.g., within 10%, within 20%, etc.), the storage capacity of capacitor 78 or 88 may be greater than (e.g., greater than 5 times, greater than 10 times, greater than 100 times, etc.) the storage capacity of the floating diffusion region, and/or the storage capacity of capacitor 68 may be greater than, similar to, or less than the storage capacity of capacitor 48. These configurations and relationships between capacitors are merely illustrative. If desired, other charge storage structures may be used instead of or in addition to these capacitors.

In one configuration sometimes described herein as an illustrative example, pixel 22 may include portions formed on different (e.g., stacked and/or bonded) dies. In other words, a first portion of pixel array 20 (FIG. 2) may be formed on a first die (or wafer) and a second portion of pixel array 20 may be formed on a second die (or wafer). In this illustrative configuration, the charge integration portion of pixels 22 in array 20 may be formed on a first die such as die 94, and the voltage-domain sampling portion of pixels 22 in array 20 may be formed on a second die such as die 96. As shown in FIG. 3, for an illustrative pixel 22, the charge integration portion of pixel 22 on die 94 may be connected to the voltage-domain sampling portion of pixel 22 on die 96 using a coupling structure 98. Coupling structure 98 may include any suitable structures for forming interconnections within a single die such as conductive vias, (metal) interconnect layers, and bond pads on respective dies, and any suitable structures for forming (physical and electrical) interconnections between dies such as micro-bumps, bumps, balls, pillars, vias, etc. formed from solder or other conductive material.

The example of pixel 22 as depicted in FIG. 3 is merely illustrative. If desired, portions of pixel 22 may be split differently across the two dies, may be split between more than two dies, may be implemented on a single die, etc.

Voltage terminals are depicted in FIG. 3 as all being separate entities. This is merely illustrative. If desired, any suitable number of power supplies (including ground connections) may be provided to one or more of the voltage terminals. As examples, a power supply may be coupled to and shared by any of number of voltage terminals in the pixel, and to implement a controllable and variable reference voltage signal to one or more of the voltage terminals, multiple power supplies may be switchably or selectively coupled to one or more of the voltage terminals.

While configurations in which a pixel includes three capacitors in its sampling stage (one of which is shared for the sampling of two different types of signals) are described herein as an illustrative example, this is merely illustrative. If desired, a pixel may include any suitable number of capacitors (e.g., four capacitors, greater than four capacitors, etc.) one (or more) of which is shared for the sampling of two or more different types of signals (e.g., a reset level signal and an image level signal).

Figure 4:
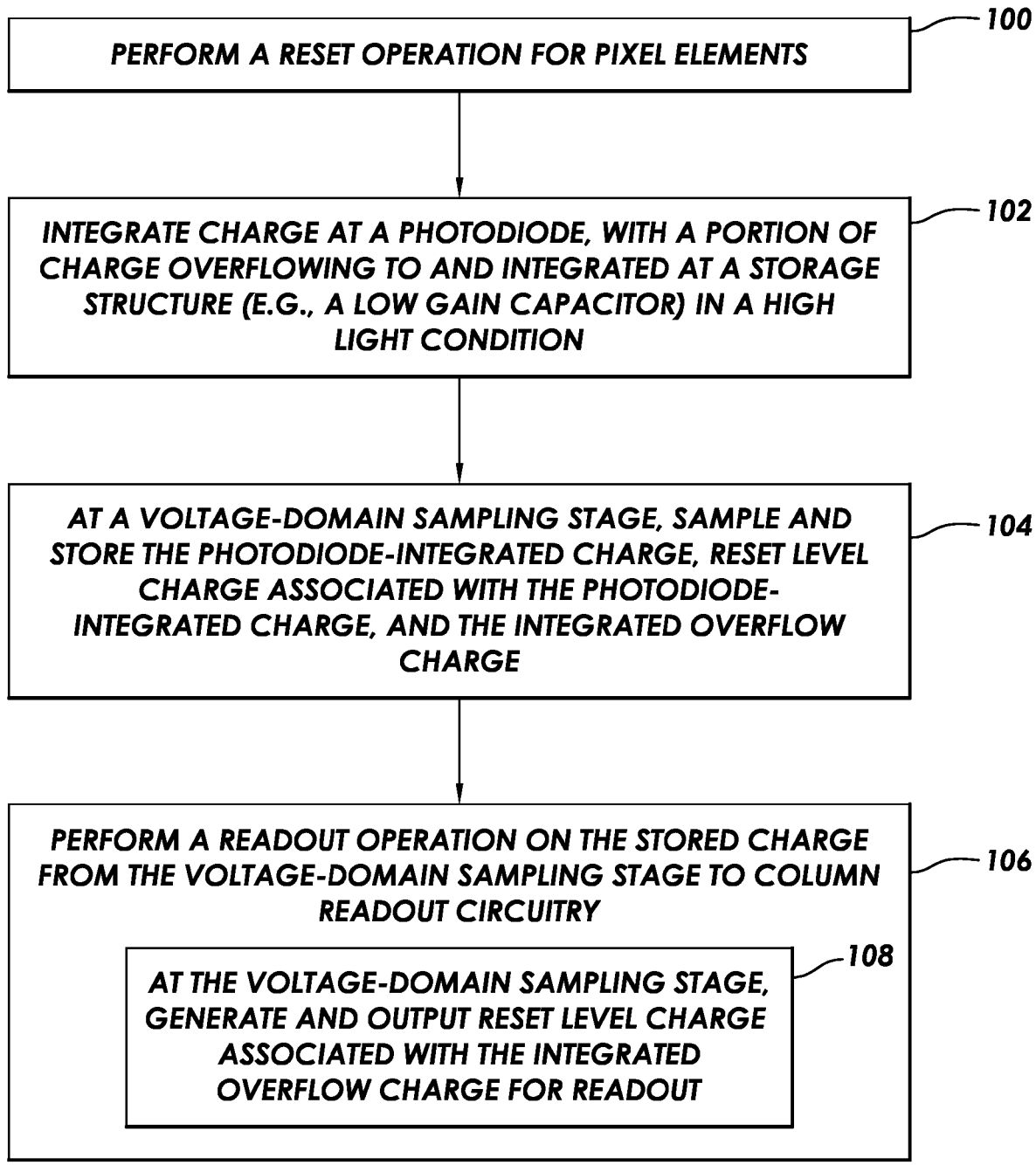
FIG. 4 is a flow chart of illustrative operations for using an image sensor pixel having voltage-domain sampling circuitry in accordance with some embodiments.

FIG. 4 is a flow chart of illustrative operations for using one or more pixels such as pixel 22 in FIG. 3. As shown in FIG. 4, at block 100, a pixel may perform a reset operation for its elements. In particular, charge storage elements in the pixel such as the photodiode, the floating diffusion region, and one or more capacitors or other charge storage structure may be connected to one or more voltage terminals each providing a corresponding reset level voltage (e.g., a power supply voltage).

At block 102, the pixel may integrate charge at a photodiode or other photosensitive element during an integration time period. While integrating charge at the photodiode, the pixel may periodically transfer an overflow portion of the photodiode-generated charge to a capacitor or other charge storage structure. The pixel may therefore integrate the overflow charge at a capacitor, while integrating the remaining charge at the photodiode during the same integration time period. Accordingly, in a high light condition, the capacitor may integrate excess overflow charge to generate a high light image signal.

At block 104, the pixel may perform voltage-domain sampling of the integrated charge and reset level charge. In particular, a first capacitor may sample and store a low conversion gain image level signal associated with the capacitor-integrated overflow charge (in combination with the photodiode-integrated remaining charge, and any leftover charge), a second capacitor may sample and store a high conversion gain image level signal associated with the photodiode-integrated remaining charge, and a third capacitor may sample and store a high conversion gain reset level signal associated with reset level charge.

At block 106, the pixel may perform a readout operation for each of the sampled and stored voltage signals (e.g., the low conversion gain image level signal, the high conversion gain image level signal, and the high conversion gain image level) from the pixel to column readout circuitry (e.g., via a column line, when a row select transistor is activated).

Because a low conversion gain reset level signal is not generated prior to starting the readout operation, during the readout operation, the pixel may generate, sample, and store a low conversion gain reset level signal associated with reset level charge at block 108. During the readout operation, the pixel may also perform readout for and output the low conversion gain reset level signal to column readout circuitry (e.g., via the column line, when the row select transistor is activated) at block 108.

The operations of the pixel as described in each of the blocks in FIG. 4 may include assertion of control signals for corresponding transistors and/or other elements to configure the pixel to perform one or more of these operations. In particular, control circuitry such as row control circuitry (e.g., circuitry 26 in FIG. 2), column control circuitry (e.g., circuitry 28 in FIG. 2), and/or other control circuitry (e.g., circuitry 24 in FIG. 2, circuitry 18 in FIG. 1) may be configured to control the pixel to perform the operations as described in each block.

While these operations are described in connection with a single pixel, they can similarly be applied to one or more other pixels in the same pixel array in any suitable manner. In one illustrative example, operations in blocks 100, 102, and 104 may be performed globally across all pixels in the pixel array (e.g., a global shutter operation, a global integration operation, a global sampling operation), and operations in block 106 and block 108 may be performed in a row-by-row manner (e.g., only pixels in the same row of the array may perform the readout operation in block 106 simultaneously using their corresponding column lines, pixels in the same row of the array may generate, sample, store, and read out the low conversion gain reset level signal (e.g., output reset level charge associated with the integrated overflow charge) simultaneously.

If desired, one or more operations described in connection with FIG. 4 need not to occur strictly sequentially as depicted in FIG. 4. As an example, the reset operation for pixel elements at 100 may occur at multiple instances: a first instance for a first set of pixel elements before the charge integration operation, a second instance for a second set of pixel elements after the charge integration operation, etc. If desired, portions of the one or more operations described in connection with FIG. 4 may occur simultaneously or in other orders.

Figure 5:
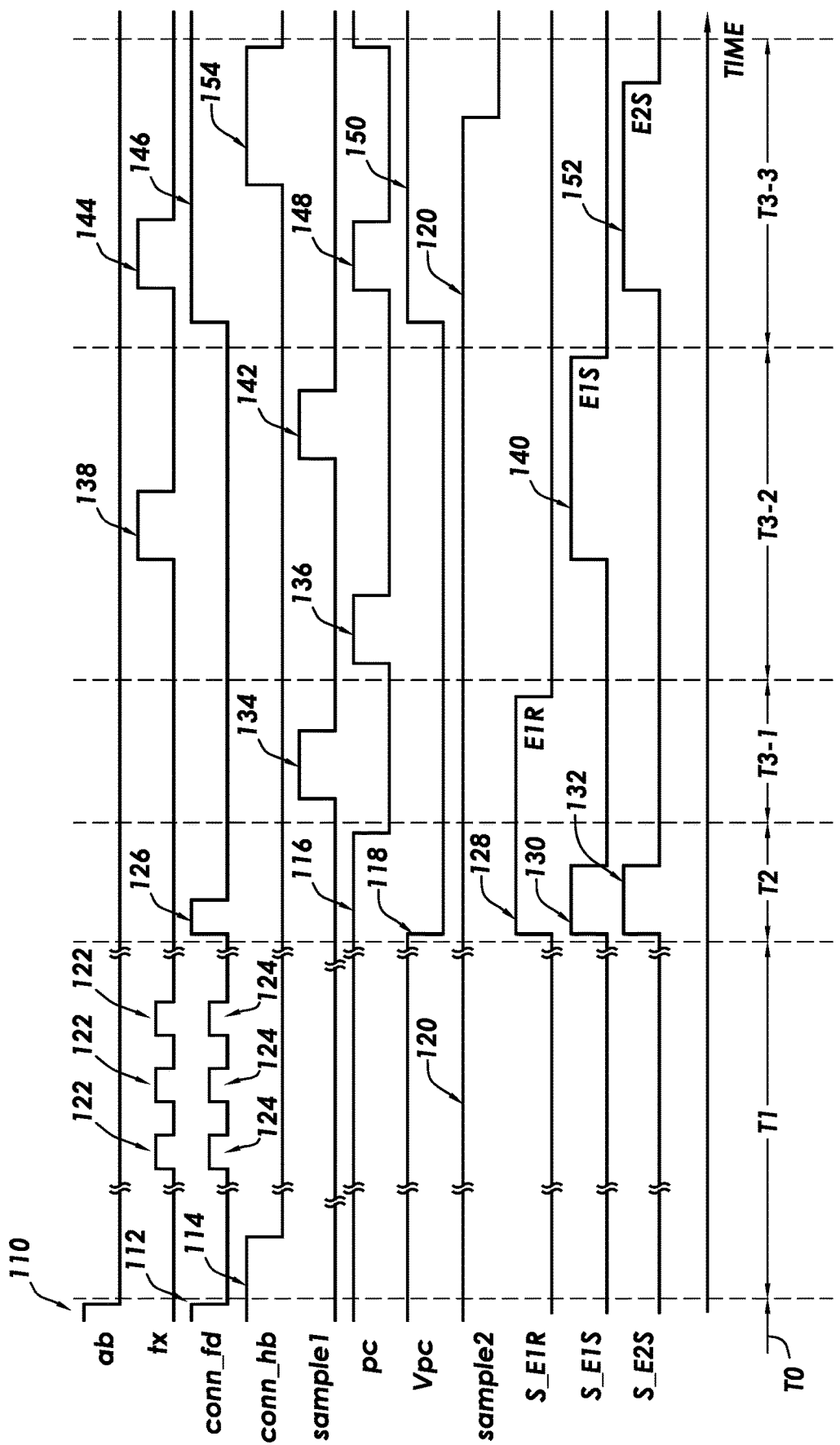
FIG. 5 is an illustrative timing diagram for operating an image sensor pixel to integrate and sample charge in accordance with some embodiments.
Figure 6:
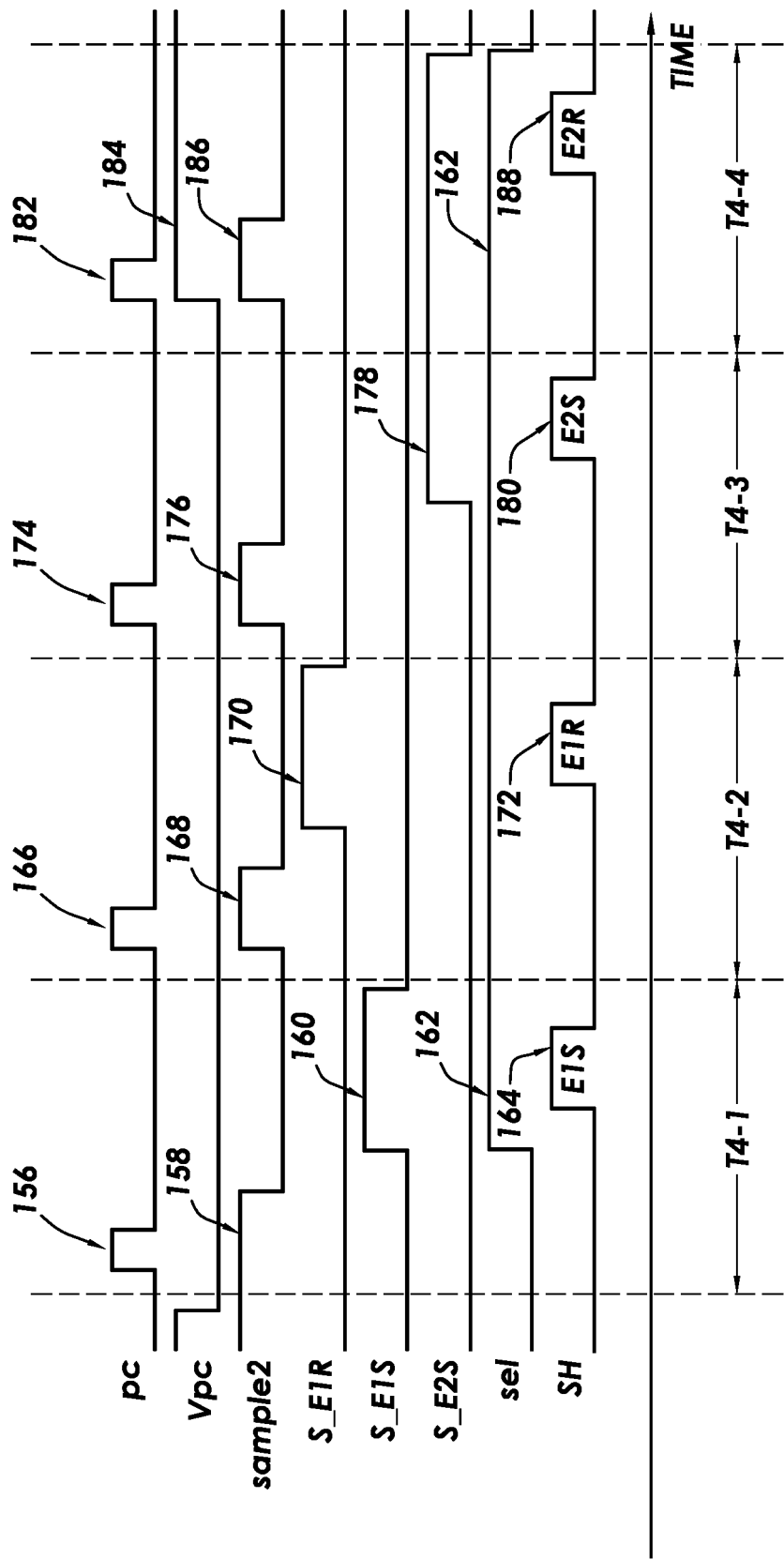
FIG. 6 is an illustrative timing diagram for operating an image sensor pixel to perform a readout operation in accordance with some embodiments.

FIGS. 5 and 6 are illustrative timing diagrams for operating one or more image pixels such as one or more pixels 22 in FIG. 3 (e.g., based on the general operations described in the flow chart in FIG. 4). Configurations in which the timing diagrams are used in connection with pixel 22 in FIG. 3, image sensor 16 in FIG. 2, and/or imaging system 10 in FIG. 1 are described herein as illustrative examples. If desired, the timing diagrams of FIGS. 5 and 6 may be used in connection with image pixels having other configurations, image sensors having other configurations, and/or imaging systems having other configurations.

In the illustrative configurations in which pixel 22 in FIG. 3, image sensor 16 in FIG. 2 and/or imaging system 10 in FIG. 1 employ the illustrative timing diagrams of FIGS. 5 and 6, control signals 'ab', 'tx', 'conn_fd', 'conn_hb', 'sample1', 'pc', 'Vpc', 'sample2', 'S_E1R', 'S_E1S', 'S_E2S', 'sel' and 'SH' may be used to control the operation of pixel 22. In particular, control circuitry (e.g., the control circuitry for image sensor 16 such as row control circuitry 26 and/or control circuitry 24 in FIG. 2) may be configured to provide (e.g., assert and deassert) one or more (e.g., all) of these controls signal to corresponding elements in pixel 22 (and to other circuitry such as readout circuitry 28) via respective control lines 30 (FIG. 2) and other control paths.

With reference to pixel 22 in FIG. 3, the control circuitry may provide each control signal in FIGS. 5 and 6 to a corresponding element shown in FIG. 3 to receive that control signal. With reference to readout circuitry 28 in FIG. 2, the control circuitry may provide control signal 'SH' to corresponding readout circuitry components such as sampling-and-hold circuits and sampling switches or circuits in readout circuitry 28. Some control signals for pixel 22 are omitted from FIGS. 5 and/or 6 in order to not obscure the embodiments described. If desired, pixel 22 may be operated using any number of additional control signals, as suitable and to impart additional advantages or features.

Referring first to FIG. 5, the control circuitry may operate pixel 22 during a charge integration reset (or shutter) time period T0, an integration time period T1, a sampling capacitor reset time period T2, and voltage-domain sampling time periods T3-1, T3-2, and T3-3.

During reset time period T0, the control circuitry may assert control signals 'ab' (assertion 110), 'conn_fd' (assertion 112), 'conn_hb' (at assertion 114), 'pc' (assertion 116), and 'Vpc' (assertion 118) to reset pixel elements in pixel 22 (e.g., floating diffusion region 44, photodiode 40, and capacitor 48 in FIG. 3) to a reset voltage level (e.g., a pixel power supply voltage supplied at voltage terminal 63 in FIG. 3). In particular, the assertion of control signal 'Vpc' may enable voltage terminal 63 to provide the reset voltage level. Voltage terminal 63 may be connected to floating diffusion region 44 and capacitor 48 via transistors 62, 50, and 46. Voltage terminal 53 supplying the reset voltage level may be connected to photodiode 40. If desired, the control circuitry may also assert control signal 'sample2' (assertion 120) to hold path 61 at a reset voltage level, during time period T0.

After photodiode 40 has been reset to a reset voltage level (e.g., after the deassertion (falling edge) of control signal 'ab' during time period T0), an integration time period T1 for photodiode 40 may begin, and photodiode 40 may begin generating and integrating charge in response to incident light.

During integration time period T1, the control circuitry may partially assert control signal 'tx' (see, e.g., partial assertion 122 in FIG. 5) to set a (voltage) potential barrier for photodiode 40. This potential barrier may set or define the overflow portion of charge from photodiode 40 (e.g., charge above the potential barrier) and set or define the remaining portion of charge at photodiode 40 (e.g., charge below the potential barrier). During integration time period T1, the control circuitry may also partially assert control signal 'conn_fd' (see e.g., partial assertion 122 in FIG. 5) to similarly set a potential barrier. By keeping both transistors 42 and 46 (FIG. 3) activated by the partial assertions during integration time period T1, pixel 22 allows the overflow charge in excess of a desired amount to transfer from photodiode 40 to floating diffusion region 44 (via transistor 42) and further to capacitor 48 (via transistor 46). Any suitable number of partial assertion sets may be used during time period T1 (e.g., far in excess of the three shown in FIG. 5). While all charge may be generated at photodiode 40 initially, overflow or excess portions of charge may be integrated at capacitor 48 and remaining portions of charge may be integrated at photodiode 40.

Partial assertions of control signals 'tx' and 'conn_fd' may be to one or more suitable voltage levels to control the corresponding transistor to form one or more potential barriers at corresponding desired levels. As an illustrative example, the control circuitry may provide a control signal at a first voltage level to fully assert the control signal, may provide the control signal at a second voltage level to deassert the control signal, and may provide a third suitable voltage level between the first and second voltage level to partially assert the control signal. The third voltage level for each control signal may vary and may be adjusted as desired depending on the type and function of the control signal (e.g., to provide a desired potential barrier level, to ensure sufficient charge transfer, etc.) and depending on the configuration of the transistor being controlled.

After an integration time period T1 of a suitable duration, a second reset time period T2 may begin. During reset time period T2, the control circuitry may assert control signal 'conn_fd' (assertion 126) to redistribute the overflow charge between capacitor 48 and floating diffusion region 44 (e.g., proportionally distribute charge between them based on their respective charge storage capacities).

When the overflow charge is redistributed between capacitor 48 and floating diffusion region 44 using assertion 126, minimal charge is left at floating diffusion region 44 because the storage capacity of capacitor 48 is much greater than (e.g., more than 10 times greater than) the storage capacity of floating diffusion region 44. In other words, during this redistribution, almost all of the overflow charge is transferred out of floating diffusion region 44. This effectively serves as a reset operation for floating diffusion region 44 (e.g., resetting floating diffusion region to a reset level voltage).

During reset time period T2, the control circuitry may also assert control signals 'pc' (assertion 116), 'sample2' (assertion 120), 'S_E1R' (assertion 128), 'S_E1S' (assertion 130), and 'S_E2S' (assertion 132), and deassert control signal 'Vpc' to reset sampling capacitors (e.g., capacitors 68, 78, and 88) to a reference voltage level (e.g., a ground voltage level or otherwise a voltage level different from the reset voltage level). In particular, while the assertion of control signal 'Vpc' (assertion 118) may enable voltage terminal 63 to provide the reset voltage level, the deassertion of control signal 'Vpc' (at the falling edge of assertion 118) may enable voltage terminal 63 to provide the reference voltage level. Voltage terminal 63 (this time supplying the reference voltage level) may be connected to capacitors 68, 78, and 88 via transistors 62, 64, 66, 76, and 86.

After reset time period T2, three voltage-domain sampling time periods may occur sequentially. During first voltage-domain sampling time period T3-1, the control circuitry may assert control signals 'sample1' (assertion 134), 'sample2' (assertion 120), and 'S_E1R' (assertion 128) to sample and store a high conversion gain reset level signal (sometimes referred to herein more generally as a reset level signal for low light or a low light reset level signal) at capacitor 78. As described above, assertion 126 may serve to effectively reset floating diffusion region 44 to a reset voltage level. This reset voltage level at floating diffusion region 44 may be sampled through source follower transistor 54 and stored at capacitor 78 via transistors 76, 64, and 56.

During second voltage-domain sampling time period T3-2, the control circuitry may initially assert control signals 'pc' (assertion 136) and 'sample2' (assertion 120) to reset or pre-charge paths 60 and 61 to the reference voltage level (provided at voltage terminal 63) in preparation for the subsequent sampling operation. Thereafter, to perform the sampling operation, the control circuitry may firstly assert control signal 'tx' (assertion 138) to transfer photodiode-integrated remaining (not overflowed) charge from photodiode 40 to floating diffusion region 44, and secondly assert control signals 'sample1' (assertion 142), 'sample2' (assertion 120), and 'S_E1S' (assertion 140) to sample and store a high conversion gain image level signal (sometimes referred to herein more generally as an image level signal for low light or a low light image level signal) at capacitor 88. In particular, the photodiode-integrated remaining charge at floating diffusion region 44 may be sampled through source follower transistor 54 and stored at capacitor 88 via transistors 86, 64, and 56. Control signals 'sample2' and 'S_E1S' may, if desired, also be asserted during assertion 138.

The sampling of the reset level signal for low light during time period T3-1 and the sampling of the image level signal for low light during time period T3-2, in combination, form a correlated double-sampling for low light.

During third voltage-domain sampling time period T3-3, the control circuitry may initially assert control signals 'tx' (assertion 144) and 'conn_fd' (assertion 146), to transfer any leftover photodiode-generated charge (e.g., charge not transferred with previous assertion 138) to floating diffusion region 44 and capacitor 48 and to share all photodiode-generated charge (e.g., overflow charge, remaining charge previously transferred, and any leftover charge currently transferred) between floating diffusion region 44 and capacitor 48 in preparation for the subsequent sampling operation. In other words, following this transfer and connection, charge including the capacitor-integrated overflow charge, the photodiode-integrated remaining charge, and the last leftover charge may be shared between floating diffusion region 44 and capacitor 48. While asserting control signals 'tx' and 'conn_fd' as described above, the control circuitry may also assert control signals 'pc' (assertion 148), 'Vpc' (assertion 150), 'sample2' (assertion 120), and 'S_E2S' (assertion 152) to reset or pre-charge paths 60 and 61, and capacitor 68 to the reset level voltage (provided at voltage terminal 63). Thereafter, to perform the sampling operation, the control circuitry may assert control signals 'conn_fd' (assertion 146), 'conn_hb' (assertion 154), 'sample2' (assertion 120), and 'S_E2S' (assertion 152), and if desired, 'Vpc' (assertion 150) to sample and store a low conversion gain image level signal (sometimes referred to herein more generally as an image level signal for high light or a high light image level signal) at capacitor 68. In particular, because control signal 'sample1' is deasserted and therefore transistor 56 is deactivated, all of the charge shared between capacitor 48 and floating diffusion region 44 (using transistor 46) may be further shared with capacitor 68 via transistors 66 and 64, path 58, and transistor 50. This charge sharing operation allows the low conversion gain image level signal to be sampled and stored at capacitor 68 while bypassing source follow transistor 54.

The illustrative timing diagram of FIG. 5 exemplifies reset operations (e.g., at block 100 in FIG. 4), charge integration operations (e.g., at block 102 in FIG. 4), and voltage-domain sampling operations (e.g., at block 104 in FIG. 4) for pixels 22 in a pixel array. Configurations in which the timing diagram of FIG. 5 is used globally across the pixel array (e.g., simultaneously across all rows) are sometimes described herein as illustrative examples. The example of FIG. 5 is merely illustrative. If desired, any suitable modifications and/or additions may be made to the timing control depicted in FIG. 5.

As an example, other temporal alignments of rising and falling edges for signal assertions differing from what is depicted in FIG. 5 may be also be used (e.g., without departing from at least some of the corresponding features described above). As another example, control signals for varying the voltage received at reference terminals of capacitors such as at terminals 49, 69, 79, and 89 across time periods T0, T1, T2, T3-1, T3-2, and T3-3 may be used (e.g., to lower a reference voltage at terminals 49, 69, 79, and 89 during integration time period T1 relative to a reference voltage at terminals 49, 79, and 89 during the other time periods). As yet another example, the order of sampling for the high conversion gain signals and the low conversion gain signal may be modified (e.g., sampling of the low conversion gain signal may occur before sampling of the high conversion gain signals, or more explicitly, a suitably modified time period T3-3 may occur first, followed by a suitably modified time period T3-2, and lastly by a suitably modified time period T3-1).

Referring next to FIG. 6, which illustrates readout operations (e.g., at block 106 in FIG. 4) and high light reset level signal generation, sampling and readout operations (e.g., at block 108 in FIG. 4), the control circuitry may operate pixel 22 during signal readout time periods T4-1, T4-2, T4-3, and T4-4, where time period T4-4 also includes high light reset level signal generation, sampling and readout operations.

During readout time period T4-1, the control circuitry may initially assert control signals 'pc' (assertion 156) and 'sample2' (assertion 158) to reset or pre-charge path 61 to the reference voltage level (provided at voltage terminal 63 when control signal 'Vpc' is deasserted) in preparation for the subsequent readout operation. Thereafter, to perform the readout operation, the control circuitry may assert control signals 'S_E1S' (assertion 160), 'sel' (assertion 162), 'SH' (assertion 164) to read out a high conversion gain image level signal at capacitor 88 from pixel 22 onto column line 32. In particular, the charge associated with the high conversion gain image level signal may be read out through source follower transistor 90 via transistors 86 and 92. Control signal 'SH' as asserted may activate corresponding sampling circuitry in column readout circuitry 28 to sample and store the high conversion gain image level signal, and/or if desired, perform further processing (e.g., analog-to-digital conversion operations) for the high conversion gain image level signal.

During readout time period T4-2, the control circuitry may again initially assert control signals 'pc' (assertion 166) and 'sample2' (assertion 168) to reset or pre-charge path 61 to the reference voltage level (provided at voltage terminal 63 when control signal 'Vpc' is deasserted) in preparation for the subsequent readout operation. Thereafter, to perform the readout operation, the control circuitry may assert control signals 'S_E1R' (assertion 170), 'sel' (assertion 162), 'SH' (assertion 172) to read out a high conversion gain reset level signal at capacitor 78 from pixel 22 onto column line 32. In particular, the charge associated with the high conversion gain reset level signal may be read out through source follower transistor 90 via transistors 76 and 92. Control signal 'SH' as asserted may activate corresponding sampling circuitry in column readout circuitry 28 to sample and store the high conversion gain reset level signal, and/or if desired, perform further processing (e.g., analog-to-digital conversion operations) for the high conversion gain reset level signal.

During readout time period T4-3, the control circuitry may again initially assert control signals 'pc' (assertion 174) and 'sample2' (assertion 176) to reset or pre-charge path 61 to the reference voltage level (provided at voltage terminal 63 when control signal 'Vpc' is deasserted) in preparation for the subsequent readout operation. Thereafter, to perform the readout operation, the control circuitry may assert control signals 'S_E2S' (assertion 178), 'sel' (assertion 162), 'SH' (assertion 180) to read out a low conversion gain image level signal at capacitor 68 from pixel 22 onto column line 32. In particular, the charge associated with the low conversion gain image level signal may be read out through source follower transistor 90 via transistors 66 and 92. Control signal 'SH' as asserted may activate corresponding sampling circuitry in column readout circuitry 28 to sample and store the low conversion gain image level signal, and/or if desired, perform further processing (e.g., analog-to-digital conversion operations) for the low conversion gain image level signal.

During readout time period T4-4, the control circuitry may initially assert control signals 'pc' (assertion 182), 'Vpc' (assertion 184), 'sample2' (assertion 186), and 'S_E2S' (assertion 178) to generate, sample, and store a low conversion gain reset level signal at capacitor 68 in preparation for the subsequent readout operation. In particular, voltage terminal 63 providing the reset voltage level (when control signal 'Vpc' is asserted) may be electrically connected to capacitor 68 via transistors 62, 64, and 66. Thereafter, to perform the readout operation, the control circuitry may assert control signals 'S_E2S' (assertion 178), 'sel' (assertion 162), 'SH' (assertion 188) to readout a low conversion gain reset level signal at capacitor 68 from pixel 22 onto column line 32. In particular, the charge associated with the low conversion gain reset level signal may be read out through source follower transistor 90 via transistors 66 and 92. Control signal 'SH' as asserted may activate corresponding sampling circuitry in column readout circuitry 28 to sample and store the low conversion gain reset level signal, and/or if desired, perform further processing (e.g., analog-to-digital conversion operations) for the low conversion gain reset level signal.

Configurations in which the timing diagram of FIG. 6 is used in a row-by-row (rolling) manner across the pixel array are sometimes described herein as illustrative examples. The example of FIG. 6 is merely illustrative. If desired, any suitable modifications and/or additions may be made to the timing control depicted in FIG. 6. As an example, various temporal alignments of rising and falling edges for signal assertions differing from what is depicted in FIG. 5 may be also be used (e.g., without departing from at least some of the corresponding features described above).

As another example, the order of performing each of readout operations T4-1, T4-2, T4-3, and T4-4 may be modified as desired insofar as the low conversion gain reset level signal may be properly generated and read out, such as if time period T4-4 follows (e.g., immediately after or with an intervening time period therebetween) time period T4-3. If desired, time period T4-2 may occur before time period T4-1, time periods T4-1 and T4-2 may occur after time period T4-4, etc.

The configuration of pixel 22 in FIG. 3 and its operation in connection with FIGS. 4-6 are merely illustrative. Configurations in which pixel 22 in FIG. 3 is implemented in a modified manner within array 20 in FIG. 2 may also be used.

Figure 7:
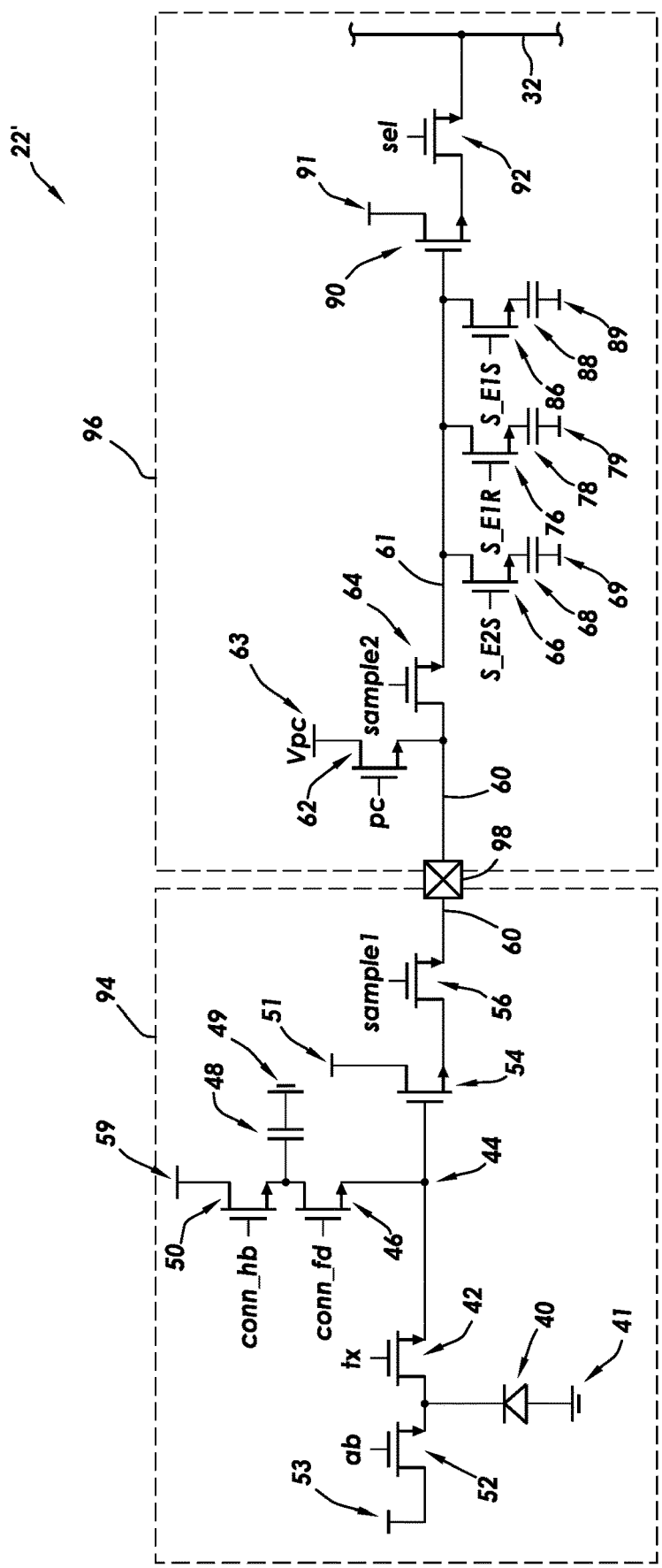
FIG. 7 is a circuit diagram of an illustrative image sensor pixel that omits a direct sampling path for overflow charge in accordance with some embodiments.

In some illustrative embodiments, pixels in array 20 may omit path 58 (shown in FIG. 3). FIG. 7 is a circuit diagram of an illustrative pixel 22' that excludes path 58 from pixel 22 in FIG. 3. If desired, array 20 in FIG. 2 may include pixels such as pixels 22'. If desired, pixel 22' may be configured to share the use of the high conversion gain reset level signal as the only reset level signal for both the high conversion gain image level signal and the low conversion gain image level signal.

In some illustrative embodiments, pixel 22 in FIG. 3 (or if desired, pixel 22' in FIG. 7) may omit transistor 52. This may provide further space-savings for the pixel. However, this may result in less flexible operations.

In some illustrative embodiments, pixel 22 in FIG. 3 may omit transistor 64. In particular, transistor 64 may be configured to decouple the sampling portion of pixel 22 to the right of transistor 64 (in FIG. 3) from parasitic capacitances at the portion of pixel 22 to the left of transistor 64 (in FIG. 3). If desired, in some pixel implementations where the parasitic capacitances are not as impactful or are acceptable (e.g., in a monolithic implementation where the entirety of pixel 22 is formed on a single die/wafer), transistor 64 may be omitted.

Figure 8:
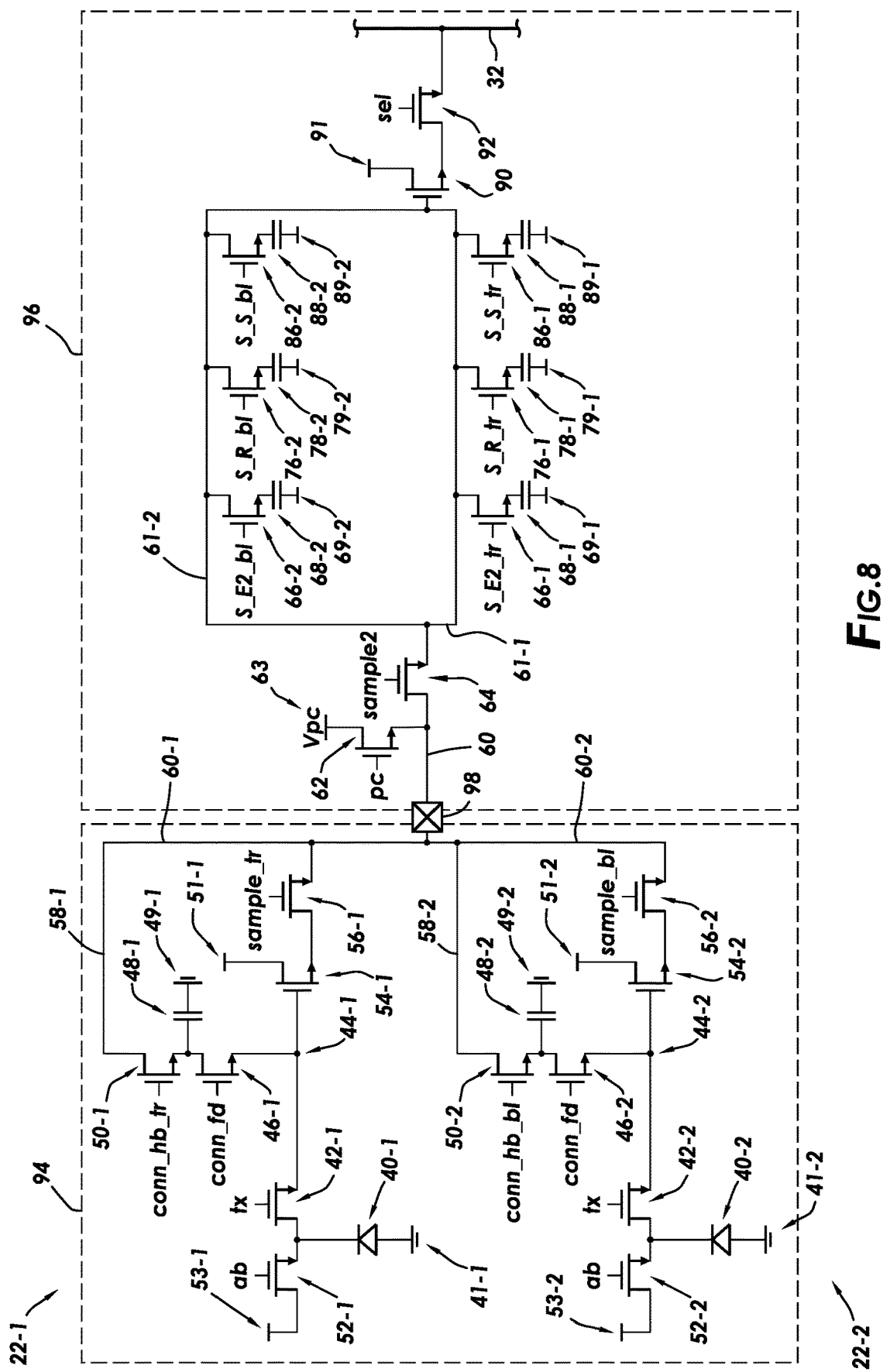
FIG. 8 is a circuit diagram of illustrative image sensor pixel circuitry with shared voltage-domain sampling circuitry in accordance with some embodiments.

In some illustrative embodiments, pixel 22 in FIG. 3 (or if desired, pixel 22' in FIG. 7) may be implemented to share pixel circuitry with one or more other pixels. FIG. 8 is a circuit diagram of illustrative pixel circuitry including pixel portions that are shared between multiple pixels.

As shown in FIG. 8, pixels 22-1 and 22-2 (i.e., a first instance of pixel 22 in FIG. 3 and a second instance of pixel 22 in FIG. 3) may each have some dedicated elements as described in connection with FIG. 3 but may also have some common (shared) elements between the two pixels. In particular, the charge integration portion of each pixel (e.g., on die 94) may remain separate and dedicated for each pixel. The voltage-domain sampling portion of each pixel (e.g., on die 96) may all be shared between the two pixels with the only exceptions being the sampling capacitors and the access transistors directly coupled to the sampling capacitors. More explicitly, voltage terminal 63, transistor 62, transistor 64, transistor 90, path 60, path 61 (even though depicted separately as paths 61-1 and 61-2), voltage terminal 91, transistor 92, column line 32 may all be shared between pixels 22-1 and 22-2. Coupling structure 98 may also be shared. This type of shared architecture may further help provide space savings and/or allow for increased storage capacities of capacitors because the area usage across die 96 is more efficient.

The example of FIG. 8 is merely illustrative. If desired, pixel circuitry may be shared in other manner and across any suitable number of pixels.

Figure 9:
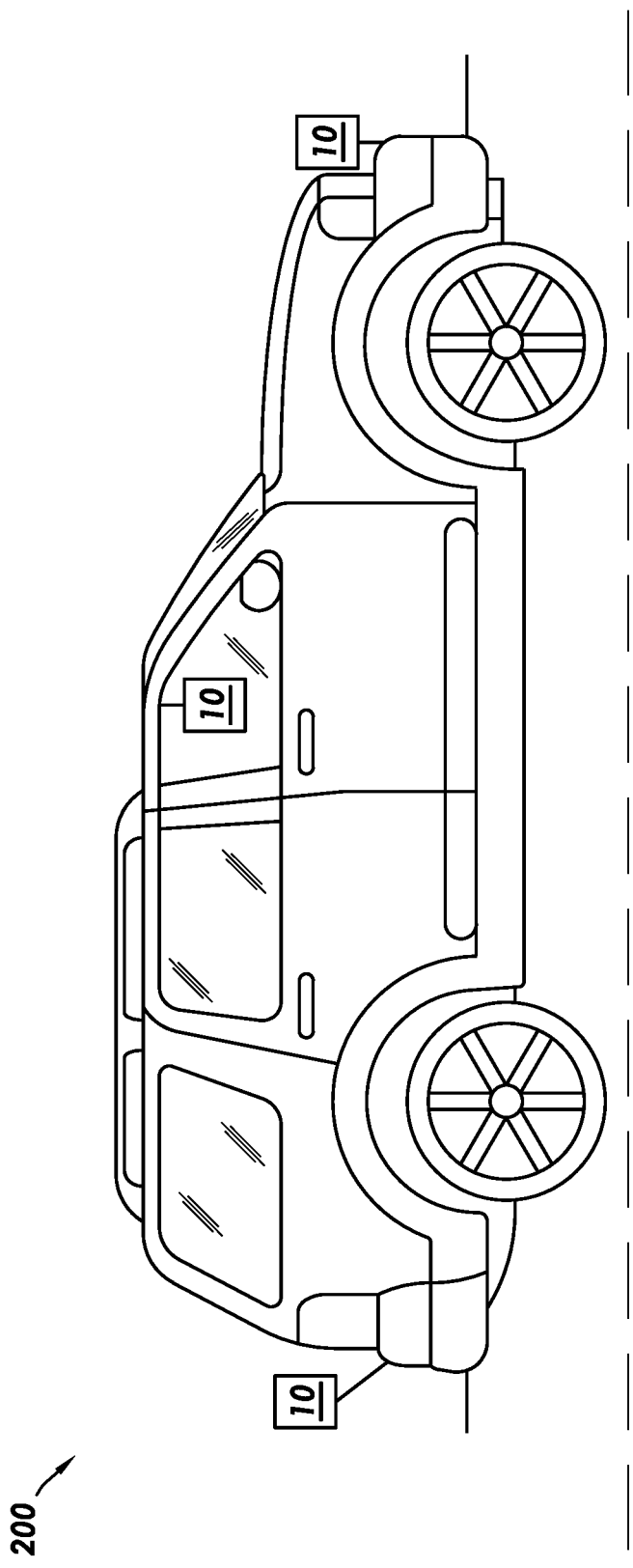
FIG. 9 is a diagram of an illustrative vehicle having an imaging system in accordance to some embodiments.

As an illustrative example, imaging system 10 in FIG. 1, imaging module 12 in FIG. 1, image sensor 16 in FIG. 2, pixel 22 in FIG. 3, pixel 22' in FIG. 7, pixels 22 in FIG. 8, and/or the corresponding operation of these components (e.g., as described in FIGS. 4-6) may be incorporated into a vehicle system such as in vehicle 200 of FIG. 9. As shown in the example of FIG. 9, vehicle 200 may include one or more imaging systems 10 (e.g., containing pixels or other components described herein). The imaging systems may form part of a vehicular safety system or other vehicular system. Imaging systems 10 may be imaging systems with dedicated image capture and/or image processing functions. If desired, an imaging system 10 may perform some or all of the image processing functions associated with a given driver assist operation. A dedicated driver assist processor may receive signals from imaging systems 10.

In another suitable example, an imaging system 10 may perform only some or none of the image processing operations associated with a given driver assist function. For example, an imaging system 10 may merely capture images of the environment surrounding the vehicle 200 and transmit the image data to other dedicated and/or central processing circuitry for further processing. Such an arrangement may be used for vehicle safety system functions that require large amounts of processing power and memory (e.g., full-frame buffering and processing of captured images).

In the illustrative example of FIG. 9, a first imaging system 10 is shown mounted on the front of car 200 (e.g., to capture images of the surroundings in front of the car), and a second imaging system 10 is shown mounted in the interior of car 200 (e.g., to capture images of the driver of the vehicle). If desired, an imaging system 10 may be mounted at the rear end of vehicle 200 (i.e., the end of the vehicle opposite the location at which first imaging system 10 is mounted in FIG. 9). The imaging system at the rear end of the vehicle may capture images of the surroundings behind the vehicle. These examples are merely illustrative. One or more imaging systems 10 may be mounted on (e.g., on the exterior of and/or within) a vehicle 200 at any desired location(s).

Configurations in which one or more imaging systems containing pixels 22 described herein are placed with respect to a vehicle to assist in vehicular operation as described in connection with FIG. 9 are merely illustrative. If desired, these imaging systems may be included in scanners (e.g., scanning systems for scanning tickets and other informational objects), industrial monitoring systems (e.g., motion tracking systems or cameras), robotic systems, or in any other suitable systems for any suitable application.

Various embodiments have been described illustrating image sensors having image pixels with voltage-domain sampling circuitry.

As an example, an image sensor pixel may include charge integration circuitry having a photosensitive element, a floating diffusion region coupled to the photosensitive element, and a source follower, and may include voltage-domain sampling circuitry having a plurality of capacitors and coupled between the floating diffusion region and a pixel output path. The source follower transistor may couple the floating diffusion region to the voltage-domain sampling circuitry along a first sampling path, and a second sampling path may couple the floating diffusion region to the voltage-domain sampling circuitry while bypassing the source follower transistor.

As another example, an image sensor pixel may include a charge integration portion having a photosensitive element, a floating diffusion region coupled to the photosensitive element, and a low gain capacitor coupled to the floating diffusion region. The image sensor pixel may further include voltage-domain sampling circuitry having fewer than four capacitors and coupling the floating diffusion region to a pixel output path.

As yet another example, an image sensor may include an image pixel and control circuitry coupled to the image pixel and configured to control the image pixel. The image pixel may include a photosensitive element, a floating diffusion region, a low conversion gain capacitor coupled to the floating diffusion region via a gain control transistor, and a voltage-domain sampling stage with a capacitor. The control circuitry may be configured to control the image pixel to store a low conversion gain image level signal at the capacitor and to store a low conversion gain reset level signal at the capacitor.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor pixel comprising:
   a photosensitive element;
   a floating diffusion region coupled to the photosensitive element;
   voltage-domain sampling circuitry comprising a plurality of capacitors and coupled between the floating diffusion region and a pixel output path;
   a source follower transistor coupling the floating diffusion region to the voltage-domain sampling circuitry; and
   a sampling path that couples the floating diffusion region to the voltage-domain sampling circuitry while bypassing the source follower transistor.

2. The image sensor pixel defined in claim 1 further comprising:
   a charge storage structure; and
   a second transistor that couples the floating diffusion region to the charge storage structure.

3. The image sensor pixel defined in claim 2, wherein the charge storage structure comprises a low gain capacitor.

4. The image sensor pixel defined in claim 2, wherein the charge storage structure and the second transistor are coupled along the sampling path.

5. The image sensor pixel defined in claim 4 further comprising:
   a third transistor coupled along the sampling path and that couples the charge storage structure to the voltage-domain sampling circuitry.

6. The image sensor pixel defined in claim 5, wherein the voltage-domain sampling circuitry comprises:
   an additional path along which the plurality of capacitors are each coupled; and
   a fourth transistor coupling the sampling path to the additional path.

7. The image sensor pixel defined in claim 6, wherein the voltage-domain sampling circuitry comprises:
   a fifth transistor coupling the sampling path to a voltage terminal.

8. The image sensor pixel defined in claim 2 further comprising:
   a third transistor coupling the photosensitive element to the floating diffusion region; and a fourth transistor coupling the photosensitive element to a voltage terminal.

9. The image sensor pixel defined in claim 2 further comprising:
a third transistor coupling the source follower transistor to the voltage-domain sampling circuitry, wherein the source follower transistor and the third transistor form an additional sampling path.

10. The image sensor pixel defined in claim 1, wherein the voltage-domain sampling circuitry has fewer than four capacitors.

11. The image sensor pixel defined in claim 10, wherein the voltage-domain sampling circuitry comprises an additional source follower transistor that couples each capacitor in the fewer than four capacitors to the pixel output path.

12. An image sensor pixel comprising:
a photosensitive element;
a floating diffusion region coupled to the photosensitive element;
a low gain capacitor coupled to the floating diffusion region; and
voltage-domain sampling circuitry having fewer than four capacitors and coupling the floating diffusion region to a pixel output path, wherein the voltage-domain sampling circuitry has first, second, and third capacitors each coupled along a path between the floating diffusion region and the pixel output path.

13. The image sensor pixel defined in claim 12, wherein the first capacitor is configured to sample two types of signals.

14. The image sensor pixel defined in claim 13, wherein the two types of signals are a reset level signal and an image level signal.

15. The image sensor pixel defined in claim 12, wherein the voltage-domain sampling circuitry has a first transistor coupling the first capacitor to the path, a second transistor coupling the second capacitor to the path, and a third transistor coupling the third capacitor to the path.

16. The image sensor pixel defined in claim 12, wherein the photosensitive element, the floating diffusion region, and the low gain capacitor are disposed on a first die, and wherein the voltage-domain sampling circuitry is disposed on a second die.

17. An image sensor comprising:
an image pixel having:
a photosensitive element;
a floating diffusion region;
a low conversion gain capacitor coupled to the floating diffusion region via a gain control transistor; and
a voltage-domain sampling stage with a capacitor; and
control circuitry coupled to the image pixel and configured to control the image pixel to store a low conversion gain image level signal at the capacitor and to store a low conversion gain reset level signal at the capacitor.

18. The image sensor defined in claim 17, wherein the voltage-domain sampling stage comprises a second capacitor, and the control circuitry is configured to control the image pixel to store a high conversion gain image level signal at the second capacitor, and wherein the voltage-domain sampling stage comprises a third capacitor, and the control circuitry is configured to control the image pixel to store a high conversion gain reset level signal at the third capacitor.

19. The image sensor defined in claim 17, wherein the control circuitry is configured to control the image pixel to store the low conversion gain reset level signal at the capacitor after performing a readout operation on the stored low conversion gain image level signal.

20. The image sensor defined in claim 17, wherein the image sensor is configured to be an image sensor for a vehicle.

* * * * *